US009530888B2

(12) United States Patent
Ban et al.

(10) Patent No.: US 9,530,888 B2
(45) Date of Patent: Dec. 27, 2016

(54) MOCVD GROWTH OF HIGHLY MISMATCHED III-V CMOS CHANNEL MATERIALS ON SILICON SUBSTRATES

(71) Applicant: Applied Materials, Inc., Santa Clara, CA (US)

(72) Inventors: Keun-Yong Ban, Santa Clara, CA (US); Zhiyuan Ye, San Jose, CA (US); Errol Antonio C. Sanchez, Tracy, CA (US); Xinyu Bao, Fremont, CA (US); David K. Carlson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/073,245

(22) Filed: Mar. 17, 2016

(65) Prior Publication Data

US 2016/0293764 A1   Oct. 6, 2016

Related U.S. Application Data

(60) Provisional application No. 62/142,084, filed on Apr. 2, 2015.

(51) Int. Cl.
*H01L 21/02* (2006.01)
*H01L 29/78* (2006.01)
(Continued)

(52) U.S. Cl.
CPC ....... *H01L 29/7849* (2013.01); *H01L 21/0262* (2013.01); *H01L 21/02381* (2013.01);
(Continued)

(58) Field of Classification Search
CPC ................... H01L 21/02381; H01L 21/02543; H01L 21/02546; H01L 21/02549; H01L 21/02609; H01L 27/092; H01L 21/0262
See application file for complete search history.

(56) References Cited

U.S. PATENT DOCUMENTS

2007/0238281 A1* 10/2007 Hudait .............. H01L 21/02381
                                                           438/604
2010/0212729 A1   8/2010 Hsu
(Continued)

FOREIGN PATENT DOCUMENTS

KR    1020040070239       8/2004
WO       2014020329 A1    2/2014

OTHER PUBLICATIONS

International Search Report and Written Opinion for International Application No. PCT/US2016/022315 dated May 31, 2016.

*Primary Examiner* — Yosef Gebreyesus
(74) *Attorney, Agent, or Firm* — Patterson & Sheridan, LLP

(57) ABSTRACT

Embodiments of the present disclosure generally relate to a semiconductor device including layers of group III-V semiconductor materials. In one embodiment, the semiconductor device includes a phosphorous containing layer deposited on a silicon substrate, wherein a lattice mismatch between the phosphorous containing layer and the silicon substrate is less than 5%, a group III-V compound nucleation layer deposited on the phosphorous containing layer at a first temperature, the group III-V compound nucleation layer having a first thickness, a group III-V compound transition layer deposited on the group III-V compound nucleation layer at a second temperature higher than the first temperature, the group III-V compound transition layer having a second thickness larger than the first thickness, and the group III-V compound nucleation layer is different from the group III-V
(Continued)

compound transition layer, and an active layer deposited on the group III-V compound transition layer.

20 Claims, 1 Drawing Sheet

(51) Int. Cl.
*H01L 29/66* (2006.01)
*H01L 29/10* (2006.01)
*H01L 29/04* (2006.01)
*H01L 29/205* (2006.01)
*H01L 27/092* (2006.01)
*H01L 21/8238* (2006.01)

(52) U.S. Cl.
CPC .. *H01L 21/02543* (2013.01); *H01L 21/02546* (2013.01); *H01L 21/02549* (2013.01); *H01L 21/02609* (2013.01); *H01L 21/823807* (2013.01); *H01L 27/092* (2013.01); *H01L 29/045* (2013.01); *H01L 29/1054* (2013.01); *H01L 29/205* (2013.01); *H01L 29/66522* (2013.01)

(56) References Cited

U.S. PATENT DOCUMENTS

| | | |
|---|---|---|
| 2010/0263707 A1 | 10/2010 | Cheong et al. |
| 2011/0045659 A1 | 2/2011 | Hudait et al. |

* cited by examiner

US 9,530,888 B2

MOCVD GROWTH OF HIGHLY MISMATCHED III-V CMOS CHANNEL MATERIALS ON SILICON SUBSTRATES

CROSS-REFERENCE TO RELATED APPLICATIONS

This application claims priority to U.S. provisional patent application Ser. No. 62/142,084, filed Apr. 2, 2015, which is herein incorporated by reference.

FIELD

Embodiments of the present disclosure generally relate to semiconductor devices. More particularly, embodiments of the present disclosure relate to a film stack including layers of group III-V semiconductor materials.

BACKGROUND

Group III-V semiconductor materials have been used in various electronic, optical, and optoelectronic devices. Examples of such devices may include metal-oxide-semiconductor field-effect transistors (MOSFETs), light emitting diodes (LEDs), or laser diodes (LDs), etc. Group III-V semiconductor materials (i.e., a combination of at least one Group III material and at least one Group V material) may be fabricated by depositing, or growing, a stack of films of group III-V semiconductor materials on an underlying substrate, such as a silicon substrate. The stack of films can form active layers having certain electrical or optical properties via strain or gap engineering. However, direct growth of certain group III-V compounds, such as InP or alloy of group III-V compounds, on a silicon substrate has been problematic due to heteroepitaxial issues such as lattice mismatch, thermal expansion mismatch, and differences in interfacial surface energy between group III-V compounds and the silicon substrate, which create dislocations that may propagate through the structure and degrade the device performance.

Therefore, there is a need in the art for a process that can enable direct growth of group III-V compounds on silicon substrate with improved quality and performance of the device.

SUMMARY

Embodiments of the disclosure relate to a film stack including layers of group III-V semiconductor materials. In various embodiments, a semiconductor device is provided. In one embodiment, the semiconductor device includes a phosphorous containing layer deposited on a silicon substrate, wherein a lattice mismatch between the phosphorous containing layer and the silicon substrate is less than 5%, a group III-V compound nucleation layer deposited on the phosphorous containing layer at a first temperature, the group III-V compound nucleation layer having a first thickness, a group III-V compound transition layer deposited on the group III-V compound nucleation layer at a second temperature higher than the first temperature, the group III-V compound transition layer having a second thickness larger than the first thickness, and the group III-V compound nucleation layer is different from the group III-V compound transition layer, and an active layer deposited on the group III-V compound transition layer.

In another embodiment, the semiconductor device includes a group III-V compound nucleation layer comprising GaAs deposited a silicon substrate at a first temperature of about 325 degrees Celsius to about 425 degrees Celsius, the group III-V compound nucleation layer having a first thickness of about 10-400 Å and a lattice mismatch between the group III-V compound nucleation layer and the silicon substrate is less than 5%, a group III-V compound buffer layer comprising GaAs deposited on the group III-V compound nucleation layer at a second temperature of about 500 degrees Celsius to about 700 degrees Celsius, the group III-V compound buffer layer having a second thickness of about 500-10000 Å, a group III-V compound insertion layer deposited on the group III-V compound buffer layer, and an active layer deposited on the group III-V compound insertion layer, wherein the active layer comprises a plurality of alternating group III-V semiconductor layers.

In yet another embodiment, a method for forming a buffer structure is provided. The method includes forming a phosphorous containing layer on a silicon substrate, wherein a lattice mismatch between the phosphorous containing layer and the silicon substrate is less than 5%, forming a group III-V compound nucleation layer on the phosphorous containing layer at a first temperature of about 325 degrees Celsius to about 425 degrees Celsius and a process pressure of about 80 torr to about 600 torr, the group III-V compound nucleation layer having a first thickness of about 10-400 Å, forming a group III-V compound transition layer on the group III-V compound nucleation layer at a second temperature of about 500 degrees Celsius to about 700 degrees Celsius and a process pressure of about 5 torr to about 300 torr, the group III-V compound transition layer having a second thickness of about 500-10000 Å, and the group III-V compound nucleation layer is different from the group III-V compound transition layer, and forming an active layer on the group III-V compound transition layer, wherein the active layer comprises a plurality of alternating group III-V semiconductor layers.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
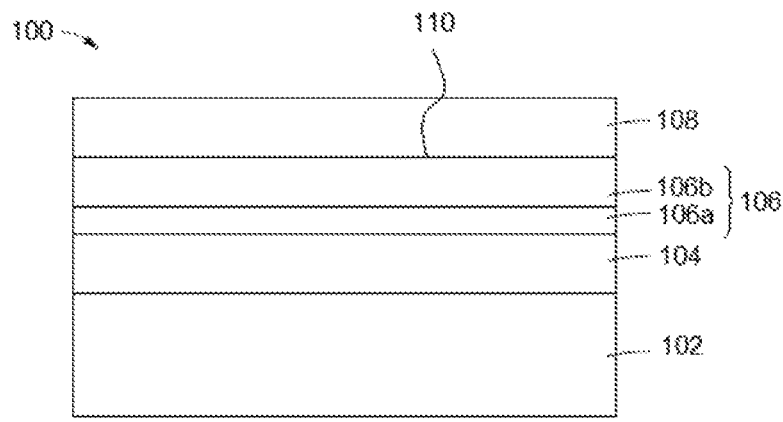
FIG. 1 schematically illustrates a film stack according to one embodiment of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure generally relate to a film stack including layers of group III and group V semiconductor materials. In various embodiments, a buffer layer including group III-V semiconductor material is formed between a silicon-based substrate and the film stack comprising layers of group III-V semiconductor materials.

The buffer layer has lattice constant closely matched to silicon-based substrate in order to mitigate lattice mismatch between the film stack and the silicon-based substrate. The buffer layer also serves as a nucleation layer for subsequent growth of the film stack. The buffer layer provides good integration between the film stack and the silicon-based substrate, while improving the surface smoothness and performance of the resulting device. Various embodiments of the present disclosure are discussed in more detail below.

FIG. 1 schematically illustrates a film stack 100 according to one embodiment of the present disclosure. The film stack 100 may be a portion of a MOSFET structure. The film stack 100 may include a phosphorous containing layer 104 deposited on a substrate 102, and a group III-V compound layer 106 deposited on the phosphorous containing layer 104. An active layer 108 may be formed on the group III-V compound layer 106. As will be discussed in more detail below, the active layer 108 may be a single layer or a stack of layers of semiconductor compounds in various embodiments.

The term "substrate" used herein is intended to broadly cover any object that can be processed in a process chamber. The substrate 102 may be any substrate capable of having material deposited thereon, such as a silicon substrate, for example silicon (doped or undoped), crystalline silicon (e.g., Si <100> or Si <111>), silicon oxide, strained silicon, doped or undoped polysilicon, germanium, a group III-V compound substrate, a silicon germanium (SiGe) substrate, a substrate having an epitaxial layer grown thereon, a silicon-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, a patterned or non-patterned semiconductor wafer, glass, sapphire, or any other materials such as metals, metal alloys, and other conductive materials. In one embodiment, the substrate 102 is a silicon-based substrate, such as a silicon substrate.

In some embodiments, the phosphorous containing layer 104 is in direct contact with the substrate 102. The phosphorous containing layer 104 has a lattice constant and a crystal orientation closely matched (i.e., lattice mismatch less than 5%) to the underlying substrate, or alternatively, upon rotation of one crystal orientation with respect to the other crystal orientation, a substantial match in lattice constants is achieved, to avoid or minimize strain (due to lattice mismatch) in the crystal lattice of the subsequent layers to be formed on the phosphorous containing layer 104. In this disclosure, the term "substantially matched" means that there is sufficient similarity between the lattice constants to permit the growth of a high quality crystalline layer on the underlying layer. Therefore, the phosphorous containing layer 104 serves as a buffer layer to accommodate lattice mismatch between the group III-V compound layer 106 and the substrate 102.

In one embodiment, the phosphorous containing layer 104 is a group III-V semiconductor compound. In cases where the substrate 102 is a silicon-based substrate, the phosphorous containing layer 104 is a GaP layer. The use of a GaP is advantageous since it provides P-terminated surface for subsequent growth of the group III-V compound layer 106 using an indium containing material such as InP. The phosphorous containing layer 104 also serves as a nucleation layer for the group III-V compound layer 106 to be formed on the phosphorous containing layer 104. As a result of GaP insertion between InP and silicon-based substrate, a mirror like shiny InP epitaxial layer on silicon-based substrate is achieved.

The group III-V compound layer 106 may serve as a nucleation layer or a transition layer for subsequent layers. The group III-V compound layer 106 may have a thickness of about 2000-5000 Angstroms (Å). The group III-V compound layer 106 may be InP, InAs, InGaAs, InGaSb, InAlSb, GaSb, or the like, depending upon the composition of the active layer 108. In one embodiment, the group III-V compound layer 106 is an InP. In some embodiments, the group III-V compound layer 106 may be a bi-layer including a thin group III-V compound nucleation layer 106a deposited on the phosphorous containing layer 104 and a thick group III-V compound transition layer 106b deposited on the thin group III-V compound nucleation layer. The thin group III-V compound nucleation layer 106a may have a thickness of about 10-400 Å, such as about 100 Å, and the thick group III-V compound transition layer 106b may have a thickness of about 500-4500 Å, such as about 1000 Å.

In one example, the thin group III-V compound nucleation layer 106a and the thick group III-V compound transition layer 106b are both InP. In such a case, the thin group III-V compound nucleation layer 106a may include about 5% to about 95% of In by weight of the total InP, for example about 20% to about 75% of In by weight of the total InP, such as about 35% to about 55% of In by weight, and the thick group III-V compound transition layer 106b may include about 5% to about 95% of In by weight of the total InP, for example about 20% to about 85% of In by weight of the total InP, such as about 45% to about 75% of In by weight. The thin group III-V compound nucleation layer 106a and the thick group III-V compound transition layer 106b may be different in composition weight percentage. For example, thin group III-V compound nucleation layer 106a may be InP having In constituting 45% by weight of the total InP, while the thick group III-V compound transition layer 106b may be InP having In constituting 65% by weight of the total InP, or vice versa.

A high quality InP on Si can be realized by having a phosphorous containing layer 104 sandwiched between the InP bulk layer (e.g., group III-V compound layer 106) and the silicon-based substrate 102. Due to the insertion of the phosphorous containing layer 104 between the group III-V compound layer 106 and the silicon-based substrate 102, an upper surface 110 of the group III-V compound layer 106 is smooth and a root-mean-square (RMS) roughness was determined to be about 1.1 nm from Atomic Force Microscope (AFM), as compared to RMS roughness of 42.4 nm without the phosphorous containing layer 104. The resulting structure exhibits a full width at half-maximum (FWHM), by X-ray diffraction (XRD), of 1030 arcsec (about 1600 arcsec without the phosphorous containing layer 104) when only 3000 Angstroms thick InP was grown.

While the active layer 108 is shown as a single layer, the active layer 108 may alternatively be a stack of layers of semiconductor compounds. For example, the active layer 108 may include one or more layers containing group III-V compounds. As used in this disclosure, the term "III-V compounds" refers to the compounds formed by chemical elements from Group III and Group V from the periodic table of elements and can include binary, ternary, and quaternary alloys thereof and compounds with higher number of elements from Group III and V.

The active layer 108 may be part of any suitable semiconductor device, such as transistors used for amplifying or switching electronic signals, an optical device, any integrated circuit such as bipolar, N-type or P-type metal oxide semiconductor (NMOS or PMOS), or CMOS etc. In one embodiment, the active layer 108 is a channel layer of a CMOS device. In another embodiment, the active layer 108 includes a plurality of alternating group III-V semiconductor layers, such as InGaAs and InAlAs layers, which form a multiple layer structure. In yet another embodiment, the active layer 108 is an absorption layer of an optical device.

In cases where the active layer 108 includes InGaAs and InAlAs layers and the group III-V compound layer 106 contains InP, InGaAs may be disposed between InAlAs and InP. This is because aluminum containing materials are very reactive and sensitive to phosphorous containing materials. The InP layer may start to decompose when there is a break in phosphorous environment for longer than 3 seconds. For example, if a purge process to purge out the phosphorous containing gases is longer than 3 seconds, hillocks, or bumps, may be formed on an upper surface of the aluminum containing layer deposited on the phosphorous containing layer. The hillocks formed on the upper surface of the aluminum containing layer may cause problems for subsequent layers deposited on the upper surface of the aluminum containing layer, degrading the quality of the film stack.

In order to form an aluminum containing layer (e.g., InAlAs) having a smooth upper surface, a GaAs containing layer, such as the InGaAs containing layer, may be disposed between the phosphorous containing layer (e.g., InP) and the aluminum containing layer (e.g., InAlAs). The GaAs containing layer is not sensitive and not reactive to phosphorous containing materials or phosphorous environment. Thus, the transition from the phosphorous containing layer to the InGaAs containing layer can withstand a break in phosphorous environment for up to 30 seconds without significant degradation of the quality of the film stack. The transition between the InGaAs containing layer and the aluminum containing layer is smooth since both layers may be in arsenic environment.

In one embodiment, the active layer 108 is a layer stack containing, in any order, films of InGaAs/InAlAs/InGaAs. In one exemplary embodiment, the film stack contains InGaAs (In: 50-60%)/InAlAs (In: 50-60%, 500-1000 Å in thickness)/InGaAs (In: 50-60%, 100-300 Å in thickness)/InP (2000-5000 Å in thickness)/GaP (50-400 Å in thickness)/Si.

In one embodiment, the active layer 108 is a layer stack containing, in any order, films of GaAsSb/InAlAs/InGaAs. In one exemplary embodiment, the film stack contains GaAsSb (Sb: 45-55%)/InAlAs (In: 50-60%, 500-1000 Å in thickness)/InGaAs (In: 50-60%, 100-300 Å in thickness)/InP (2000-5000 Å in thickness)/GaP (50-400 Å in thickness)/Si.

In one embodiment, the active layer 108 is a layer stack containing, in any order, films of InAs/InAlAs/InGaAs. In one exemplary embodiment, the film stack contains InAs/InAlAs (In: 53-70%, 500-1000 Å in thickness)/InGaAs (In: 53-70%, 100-300 Å in thickness)/InP (2000-5000 Å in thickness)/GaP (50-400 Å in thickness).

In one embodiment, the active layer 108 is a layer stack containing, in any order, films of GaSb/AlAsSb/InAlAs/InGaAs. In one exemplary embodiment, the film stack contains GaSb/AlAsSb (As: 0-20%, 500-1000 Å in thickness)/InAlAs (In: 53-70%, 1000-5000 Å in thickness)/InGaAs (In: 53-70%, 100-300 Å in thickness)/InP (2000-5000 Å in thickness)/GaP (50-400 Å in thickness)/Si.

The layers 104, 106, 108 may be deposited by any suitable deposition method, such as a metal-oxide chemical vapor deposition (MOCVD), hydride vapor phase epitaxial (HVPE), physical vapor deposition (PVD), chemical vapor deposition (CVD), and/or atomic layer deposition (ALD) processes. In one embodiment, MOCVD is used to grow layers 104, 106, 108 using any suitable precursor material such as Tertiary butyl phosphine (TBP), Trimethyl gallium (TMGa), Trimethyl indium (TMIn), Tertiary butyl arsine (TBAs), and Triethyl antimony (TESb), etc.

In cases where a thin group III-V nucleation layer 106a and a thick group III-V transition layer 106b are employed for the layer 106, the MOCVD process of the group III-V layer 106 may be a two-step process. The first step may be depositing the thin group III-V nucleation layer 106a at a lower temperature, such as ranging from about 360 degrees Celsius to about 500 degrees Celsius, and the process pressure for depositing the nucleation layer may range from about 80 torr to about 600 torr, such as about 80 torr. For a 300 mm substrate, carrier flow rate may range from about 3 slm to about 20 slm, such as about 10 slm. In one embodiment where the thin group III-V nucleation layer 106a is InP, trimethylindium and tertiarybutylphosphine are used as precursor materials. For the first step, the trimethylindium may have a flow rate ranging from about 0.1 sccm to about 2 sccm, such as about 1 sccm and the tertiarybutylphosphine may have a flow rate ranging from about 10 sccm to about 300 sccm, such as about 50 sccm. The thickness of the thin group III-V nucleation layer 106a may range from about 10-400 Å, such as 100 Å. The second step may be depositing the thick group III-V transition layer 106b at a higher temperature, such as from about 500 degrees Celsius to about 650 degrees Celsius, and the process pressure for depositing the thick group III-V transition layer 106b may range from about 5 torr to about 300 torr, such as from about 10 torr to about 150 torr. In one embodiment where the thick group III-V transition layer 106b is InP, trimethylindium and tertiarybutylphosphine are used as precursor materials. For the second step, the trimethylindium may have a flow rate ranging from about 0.1 sccm to about 5 sccm for the 300 mm substrate, such as about 2 sccm and the tertiarybutylphosphine may have a flow rate ranging from about 10 sccm to about 500 sccm, such as about 50 sccm. The thick group III-V transition layer 106b may have a thickness ranging from about 500-4500 Å, such as about 1000 Å.

The concept discussed herein is also applicable to other group III-V compounds, such as InAs or GaSb, that have been impossible to grow conformally on silicon due to high lattice mismatch (about 12% or above) with the underlying silicon substrate. An exemplary film stack and process are discussed below with respect to FIG. 2.

Figure 2:
FIG. 2 schematically illustrates a film stack according to another embodiment of the present disclosure.

FIG. 2 schematically illustrates a film stack 200 according to another embodiment of the present disclosure. The film stack 200 may be a portion of a MOSFET structure. The film stack 200 may include a GaAs layer 204 deposited on the silicon-based substrate 102, and a group III-V compound insertion layer 206 deposited on the GaAs layer 204. An active layer 208 may be formed on the group III-V compound insertion layer 206. As will be discussed in more detail below, the active layer 208 may be a single layer or a stack of layers of semiconductor compounds in various embodiments.

The silicon-based substrate 102 is discussed above. The group III-V compound insertion layer 206 may be a binary, ternary, and quaternary alloys thereof and compounds with higher number of elements from Group III and V. In one embodiment, the group III-V compound insertion layer 206 is an indium containing layer such as InAs or InP. In one example, the group III-V compound insertion layer 206 is an InAs and has a thickness of about 2000-10000 Å. In another example, the group III-V compound insertion layer 206 is an InP and has a thickness of about 2000-5000 Å. In yet another example, the group III-V compound insertion layer 206 is a GaSb and has a thickness of about 500-1000 Å.

In another embodiment, the group III-V compound insertion layer 206 is a binary or ternary compound containing gallium, such as GaAsSb. In one example, the group III-V compound insertion layer 206 is a GaAsSb (Sb: 80-100%, 2000-10000 Å in thickness).

The GaAs layer 204 has a lattice constant and a crystal orientation closely matched (i.e., lattice mismatch less than 5%) to the underlying silicon-based substrate 102. Therefore, the GaAs layer 204 can serve as a buffer layer to mitigate lattice mismatch between the group III-V compound insertion layer 206 and the silicon-based substrate 102. If the GaAs layer is used as a buffer layer, the GaAs layer 204 may have a thicker thickness of about 500-10000 Å. In some embodiments, a thin GaAs layer 204 may be nucleated or formed on the surface of the silicon-based substrate 102 to provide Ga-terminated and/or As-terminated surface for growth of subsequent layers. If the GaAs layer is used as a nucleation layer, the GaAs layer 204 may have a thickness of about 10-400 Å. Alternatively, after a thin GaAs layer 204a is nucleated on the surface of the silicon-based substrate 102, a thick GaAs layer 204b is consecutively grown thereon for better crystal quality. In such a case, the thin GaAs layer 204a may be grown at a lower temperature, such as from about 325 degrees Celsius to about 425 degrees Celsius, while the thick GaAs layer 204b may be consecutively grown thereon at a higher temperature, such as from about 550 degrees Celsius to about 700 degrees Celsius.

In some examples, the thin GaAs layer 204a may include about 5% to about 95% of As by weight of the total GaAs, for example about 20% to about 75% of As by weight of the total GaAs, such as about 35% to about 55% of As by weight, and the thick GaAs layer 204b may include about 5% to about 95% of As by weight of the total GaAs, for example about 20% to about 85% of As by weight of the total GaAs, such as about 45% to about 75% of As by weight. The thin GaAs layer 204a and the thick GaAs layer 204b may be different in composition weight percentage. For example, in one exemplary embodiment, the thin GaAs layer 204a may have As constituted 45% by weight of the total GaAs, while the thick GaAs layer 204b may have As constituted 65% by weight of the total GaAs, or vice versa.

In some embodiments, a GaP layer (not shown) may be optionally formed between the GaAs layer 204 and the silicon-based substrate 102. Having a GaP layer sandwiched between the GaAs layer 204 and the silicon-based substrate 102 is advantageous because GaAs layers are sensitive to surface conditions and contaminations of the substrate surface. As the processing chamber ages, contaminants may be released from chamber walls and contaminate the surface of a silicon-based substrate disposed therein. Since GaAs is a polar material and silicon is a non-polar material, depositing GaAs directly on the silicon substrate may introduce antiphase domains. In addition, while the lattice constant of GaAs is closely matched silicon, there is still a 4% lattice mismatch between the GaAs layer and the silicon substrate that may cause stress and defective density at the interface between the GaAs layer and the silicon substrate. In order to reduce the sensitivity of the GaAs layer, a GaP layer may be deposited on the silicon substrate, and the GaAs layer 204 is deposited on the GaP layer. The GaP layer is a polar material, which is similar to the GaAs layer 204, and the GaP layer 204 matches the lattice constant of the silicon-based substrate 102. Thus, having the GaP layer sandwiched between the silicon-based substrate 102 and the GaAs layer 204, the sensitivity of the GaAs layer 204 is reduced.

The active layer 208 may be a single layer of group III-V compound as shown, or a stack of layers of semiconductor compounds. For example, the active layer 208 may include one or more layers containing group III-V compounds, as discussed above with respect to active layer 108.

In one embodiment, the active layer 208 is a layer stack containing, in any order, films of InAs/AlAsSb. In one exemplary embodiment, the film stack contains InAs/AlAsSb (As: 0-20%, 500-1000 Å in thickness)/InAs (2000-10000 Å in thickness)/GaAs (100-10000 Å in thickness)/Si. In another exemplary embodiment, the film stack contains InAs/AlAsSb (As: 0-20%, 500-1000 Å in thickness)/GaAsSb (Sb: 80-100%, 2000-10000 Å in thickness)/GaAs (0-10000 Å in thickness)/Si.

In one embodiment, the active layer 208 is a layer stack containing, in any order, films of InAs/InAlAs. In one exemplary embodiment, the film stack contains InAs/InAlAs (Indium: 53-70%, 500-1000 Å in thickness)/InGaAs (Indium: 53-70%, 100-300 Å in thickness)/InP (2000-5000 Å in thickness)/GaAs (100-10000 Å in thickness)/Si.

In one embodiment, the active layer 208 is a layer stack containing, in any order, films of GaSb/AlAsSb. In one exemplary embodiment, the film stack contains GaSb/AlAsSb (As: 0-20%, 500-1000 Å in thickness)/InAs (2000-10000 Å in thickness)/GaAs (100-10000 Å in thickness)/Si. In another exemplary embodiment, the film stack contains GaSb/AlAsSb (As: 0-20%, 500-1000 Å in thickness)/GaAsSb (Sb: 80-100%, 2000-10000 Å in thickness)/GaAs (0-10000 Å in thickness)/Si. In yet another exemplary embodiment, the film stack contains GaSb/AlAsSb (As: 0-20%, 500-1000 Å in thickness)/InAlAs (In: 53-70%, 1000-5000 Å in thickness)/InGaAs (In: 53-70%, 100-300 Å in thickness)/InP (2000-5000 Å in thickness)/GaAs (100-10000 Å in thickness)/Si.

The layers 204, 206, 208 may be deposited by any suitable deposition method, such as a metal-oxide chemical vapor deposition (MOCVD), hydride vapor phase epitaxial (HVPE), physical vapor deposition (PVD), chemical vapor deposition (CVD), and/or atomic layer deposition (ALD) processes. In one embodiment, MOCVD is used to grow layers 204, 206, 208 using any suitable precursor material such as Tertiary butyl phosphine (TBP), Trimethyl gallium (TMGa), Trimethyl indium (TMIn), Tertiary butyl arsine (TBAs), and Triethyl antimony (TESb), etc.

In cases where a thin nucleation GaAs layer 204a and a thick buffer GaAs layer 204b are employed for the layer 204, the MOCVD process of the GaAs layer 204 may be a two-step process. The first step may be depositing the thin nucleation GaAs layer 204a at a lower temperature, such as ranging from about 325 degrees Celsius to about 425 degrees Celsius, and the process pressure for depositing the thin nucleation GaAs layer 204a may range from about 80 torr to about 600 torr, such as about 200 torr. Carrier flow rate may range from about 3 standard liter per minute (slm) to about 20 slm, such as about 10 slm. In one embodiment, trimethylgallium and tertiarybutylarsine are used as precursor materials. For the first step, the trimethylgallium may have a flow rate ranging from about 5 standard cubic centimeters per minute (sccm) to about 50 sccm, such as about 20 sccm and the tertiarybutylarsine may have a flow rate ranging from about 10 sccm to about 100 sccm, such as about 50 sccm. The thickness of the thin nucleation GaAs layer may range from about 10-400 Å, such as about 100 Å. The second step may be depositing the thick buffer GaAs layer 204b at a higher temperature, such as from about 500 degrees Celsius to about 700 degrees Celsius, and the process pressure for depositing the thick buffer GaAs layer 204b may range from about 5 torr to about 300 torr, such as from about 10 torr to about 80 torr. For the second step, the trimethylgallium may have a flow rate ranging from about 5 sccm to about 50 sccm, such as about 10 sccm and the tertiarybutylarsine may have a flow rate ranging from about 20 sccm to about 200 sccm, such as about 75 sccm. The thick buffer GaAs layer 204b may have a thickness ranging from about 500-10000 Å, such as from about 1000-5000 Å.

Having a thick GaAs buffer layer or a thin GaAs nucleation layer (or both) sandwiched between bulk layer (e.g., group III-V compound insertion layer 206) and the silicon-based substrate 102, high quality InAs or GaSb on Si can be realized. The resulting structure exhibits a full width at half-maximum (FWHM), by X-ray diffraction (XRD), of 1200 arcsec and mirror like shiny substrate surface. From scanning Electron Microscope (SEM), there were no noticeable surface features such as pits or holes. Therefore, high lattice mismatch channel materials such as InGaAs or GaAsSb/InAlAs/InP/Si, and InAs or GaSb/AlAsSb/InAs/GaAs/Si can be grown without having to degrading material quality significantly in the most cost effective manner.

Benefits of the present disclosure include III-V device integration on Si substrates in terms of production cost and throughput. Specifically, realization of high quality InP bulk layer on silicon substrate is achieved by consecutively growing GaP and InP buffer layers, which have a lattice constant and a crystal orientation closely matched to the underlying silicon substrate, on the silicon substrate. The GaP buffer layer accommodates lattice mismatch between the subsequent InP bulk layer and the silicon substrate, thus minimizing strain in the crystal lattice of the subsequent layers to be formed on the GaP layer. The InP buffer layer also serves as a nucleation layer for the InP bulk layer. Embodiments of the present disclosure also enable formation of high quality InAs or GaSb on silicon substrate by inserting a thin GaAs nucleation layer, a thick GaAs buffer layer, or both, between InAs or GaSb and the silicon substrate. GaAs layers are optimized to mitigate huge lattice mismatch between InAs or GaSb and the silicon substrate without having to degrading material quality significantly in the most cost effective manner.

While the foregoing is directed to embodiments of the present disclosure, other and further embodiments of the disclosure may be devised without departing from the basic scope thereof.

The invention claimed is:

1. A semiconductor device, comprising:
a phosphorous containing layer deposited on a silicon substrate, wherein a lattice mismatch between the phosphorous containing layer and the silicon substrate is less than 5%;
a group III-V compound nucleation layer deposited on the phosphorous containing layer at a first temperature, the group III-V compound nucleation layer having a first thickness;
a group III-V compound transition layer deposited on the group III-V compound nucleation layer at a second temperature higher than the first temperature, the group III-V compound transition layer having a second thickness larger than the first thickness, and the group III-V compound nucleation layer is different from the group III-V compound transition layer; and
an active layer deposited on the group III-V compound transition layer.

2. The semiconductor device of claim 1, wherein the phosphorous containing layer is a group III-V compound layer.

3. The semiconductor device of claim 2, wherein the phosphorous containing layer is GaP.

4. The semiconductor device of claim 1, wherein the group III-V compound nucleation layer and the group III-V compound transition layer are InP, InAs, InGaAs, InGaSb, InAlSb, or GaSb.

5. The semiconductor device of claim 1, wherein the group III-V compound nucleation layer is InP including about 35% to about 55% of In by weight of the total InP, and the group III-V compound transition layer is InP including about 45% to about 75% of In by weight of the total InP.

6. The semiconductor device of claim 1, wherein the first temperature is about 360 degrees Celsius to about 500 degrees Celsius, and the second temperature is about 500 degrees Celsius to about 650 degrees Celsius.

7. The semiconductor device of claim 1, wherein the first thickness is about 10-400 Å and the second thickness is about 500-4500 Å.

8. The semiconductor device of claim 1, wherein the group III-V compound nucleation layer is deposited at a process pressure of about 80 torr to about 600 torr, and the group III-V compound transition layer is deposited at a process pressure of about 5 torr to about 300 torr.

9. The semiconductor device of claim 1, wherein the active layer comprises a plurality of alternating group III-V semiconductor layers.

10. The semiconductor device of claim 9, wherein the active layer comprises a layer stack containing, in any order, films of InGaAs/InAlAs/InGaAs, a layer stack containing, in any order, films of GaAsSb/InAlAs/InGaAs, a layer stack containing, in any order, films of InAs/InAlAs/InGaAs, or a layer stack containing, in any order, films of GaSb/AlAsSb/InAlAs/InGaAs.

11. A semiconductor device, comprising:
a group III-V compound nucleation layer comprising GaAs deposited a silicon substrate at a first temperature of about 325 degrees Celsius to about 425 degrees Celsius, the group III-V compound nucleation layer having a first thickness of about 10-400 Å and a lattice mismatch between the group III-V compound nucleation layer and the silicon substrate is less than 5%;
a group III-V compound buffer layer comprising GaAs deposited on the group III-V compound nucleation layer at a second temperature of about 500 degrees Celsius to about 700 degrees Celsius, the group III-V compound buffer layer having a second thickness of about 500-10000 Å;
a group III-V compound insertion layer deposited on the group III-V compound buffer layer; and
an active layer deposited on the group III-V compound insertion layer, wherein the active layer comprises a plurality of alternating group III-V semiconductor layers.

12. The semiconductor device of claim 11, wherein the group III-V compound nucleation layer is deposited at a process pressure of about 80 torr to about 600 torr, and the group III-V compound buffer layer is deposited at a process pressure of about 5 torr to about 300 torr.

13. The semiconductor device of claim 11, further comprising:
a GaP layer sandwiched between the group III-V compound nucleation layer and the silicon substrate.

14. The semiconductor device of claim 11, wherein the group III-V compound insertion layer is an indium containing layer, or a binary or ternary gallium containing compound layer.

15. The semiconductor device of claim 11, wherein the active layer comprises a layer stack containing, in any order, films of InAs/AlAsSb, a layer stack containing, in any order, films of InAs/InAlAs, or a layer stack containing, in any order, films of GaSb/AlAsSb.

16. A method for forming a buffer structure, comprising:
   forming a phosphorous containing layer on a silicon substrate, wherein a lattice mismatch between the phosphorous containing layer and the silicon substrate is less than 5%;
   forming a group III-V compound nucleation layer on the phosphorous containing layer at a first temperature of about 325 degrees Celsius to about 425 degrees Celsius and a process pressure of about 80 torr to about 600 torr, the group III-V compound nucleation layer having a first thickness of about 10-400 Å;
   forming a group III-V compound transition layer on the group III-V compound nucleation layer at a second temperature of about 500 degrees Celsius to about 700 degrees Celsius and a process pressure of about 5 torr to about 300 torr, the group III-V compound transition layer having a second thickness of about 500-10000 Å, and the group III-V compound nucleation layer is different from the group III-V compound transition layer; and
   forming an active layer on the group III-V compound transition layer, wherein the active layer comprises a plurality of alternating group III-V semiconductor layers.

17. The method of claim 16, wherein the phosphorous containing layer is GaP.

18. The method of claim 16, wherein the group III-V compound nucleation layer and the group III-V compound transition layer are InP, InAs, InGaAs, InGaSb, InAlSb, or GaSb.

19. The method of claim 16, wherein the group III-V compound nucleation layer is InP including about 35% to about 55% of In by weight of the total InP, and the group III-V compound transition layer is InP including about 45% to about 75% of In by weight of the total InP.

20. The method of claim 16, wherein the active layer comprises a layer stack containing, in any order, films of InGaAs/InAlAs/InGaAs, a layer stack containing, in any order, films of GaAsSb/InAlAs/InGaAs, a layer stack containing, in any order, films of InAs/InAlAs/InGaAs, or a layer stack containing, in any order, films of GaSb/AlAsSb/InAlAs/InGaAs.

* * * * *